United States Patent
Maffei

(10) Patent No.: US 11,598,655 B2
(45) Date of Patent: Mar. 7, 2023

(54) MAGNETIC-FIELD SENSOR WITH TEST PIN FOR CONTROL OF SIGNAL RANGE AND/OR OFFSET

(71) Applicant: Allegro MicroSystems, LLC, Manchester, NH (US)

(72) Inventor: Kevin Maffei, Hooksett, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 85 days.

(21) Appl. No.: 17/374,449

(22) Filed: Jul. 13, 2021

(65) Prior Publication Data

US 2023/0018567 A1 Jan. 19, 2023

(51) Int. Cl.
| | |
|---|---|
| *G01D 5/244* | (2006.01) |
| *G01D 5/16* | (2006.01) |
| *H03M 1/10* | (2006.01) |
| *B60T 8/171* | (2006.01) |

(52) U.S. Cl.
CPC .............. *G01D 5/244* (2013.01); *G01D 5/16* (2013.01); *H03M 1/1023* (2013.01); *B60T 8/171* (2013.01); *B60T 2240/00* (2013.01)

(58) Field of Classification Search
CPC .............. G01D 5/145; G01D 5/24428; G01D 5/24457; G01D 5/24476; G01D 5/2448; G01D 5/2454; G01D 5/2497; G01D 5/34776; G01D 18/00; G01D 18/001; H03M 1/1023; H03M 1/12; H03M 1/129; H03M 1/1295; H03M 1/303; H03M 1/485; B60T 8/171; B60T 2240/00; G01P 3/489
See application file for complete search history.

(56) References Cited

U.S. PATENT DOCUMENTS

| | | | |
|---|---|---|---|
| 6,556,154 B1 * | 4/2003 | Gorecki | H03H 11/04 341/145 |
| 7,573,393 B2 | 8/2009 | Haas et al. | |
| 7,800,389 B2 | 9/2010 | Friedrich et al. | |
| 8,754,640 B2 | 6/2014 | Vig et al. | |

(Continued)

OTHER PUBLICATIONS

U.S. Notice of Allowance dated Oct. 4, 2022 for U.S. Appl. No. 17/374,445; 9 Pages.

(Continued)

*Primary Examiner* — Steven L Yeninas
(74) *Attorney, Agent, or Firm* — Daly, Crowley, Mofford & Durkee, LLP

(57) ABSTRACT

In one aspect, an integrated circuit (IC) includes a magnetic-field sensor. The magnetic-field sensor includes digital circuitry that includes a first and second analog-to-digital converter (ADC). The digital circuitry is configured to receive a first and second analog output signals and, using the first and second ADC, configured to convert the first and second analog output signals to a first and second digital signals. The magnetic-field sensor also includes diagnostic circuitry configured to receive, from the digital circuitry, an input signal related to the first and/or the second digital signals and configured to provide a test signal at a pin of the IC. In response to a range parameter, the diagnostic circuitry is further configured to provide the test signal comprising a range of codes from the first and/or the second ADC corresponding to the range parameter.

21 Claims, 9 Drawing Sheets

(56) References Cited

U.S. PATENT DOCUMENTS

| | | |
|---|---|---|
| 8,937,797 B2 | 1/2015 | Pirchio et al. |
| 9,383,425 B2 | 7/2016 | Milano et al. |
| 9,496,884 B1* | 11/2016 | Azenkot ............. H03M 1/1023 |
| 9,520,871 B2 | 12/2016 | Eagen et al. |
| 9,645,220 B2 | 5/2017 | Cesaretti et al. |
| 9,664,748 B2 | 5/2017 | Friedrich et al. |
| 9,804,222 B2 | 10/2017 | Petrie et al. |
| 9,851,416 B2 | 12/2017 | Scheller et al. |
| 9,910,088 B2 | 3/2018 | Milano et al. |
| 10,073,136 B2 | 9/2018 | Milano et al. |
| 10,101,410 B2 | 10/2018 | Latham et al. |
| 10,132,879 B2 | 11/2018 | Latham et al. |
| 10,216,559 B2 | 2/2019 | Fernandez |
| 10,254,354 B2 | 4/2019 | Cesaretti |
| 10,451,671 B2 | 10/2019 | Petrie et al. |
| 10,466,298 B2 | 11/2019 | Chaware et al. |
| 10,488,458 B2 | 11/2019 | Milano et al. |
| 10,495,699 B2 | 12/2019 | Burdette et al. |
| 10,761,120 B2 | 9/2020 | Feucht et al. |
| 10,782,363 B2 | 9/2020 | Scheller et al. |
| 10,837,943 B2 | 11/2020 | Romero |
| 10,908,232 B2 | 2/2021 | Latham et al. |
| 10,914,797 B2 | 2/2021 | Latham et al. |
| 10,996,289 B2 | 5/2021 | Latham et al. |
| 11,047,928 B2 | 6/2021 | Vuillermet et al. |
| 11,194,004 B2 | 12/2021 | Scheller et al. |
| 2009/0001965 A1 | 1/2009 | Ausserlechner et al. |
| 2011/0298449 A1* | 12/2011 | Foletto ................... G01P 3/487 |
| | | 324/207.13 |
| 2015/0346004 A1 | 12/2015 | Mirassou et al. |
| 2016/0123768 A1 | 5/2016 | Foletto et al. |
| 2018/0340911 A1 | 11/2018 | Romero |
| 2019/0383886 A1* | 12/2019 | Shoemaker ........ G01R 33/0047 |
| 2020/0049760 A1 | 2/2020 | Milano et al. |
| 2020/0080867 A1 | 3/2020 | Foletto et al. |
| 2020/0162091 A1* | 5/2020 | Huang ................ H03M 1/0607 |
| 2020/0379061 A1 | 12/2020 | Scheller et al. |
| 2021/0215775 A1* | 7/2021 | Kulla ................. G01R 33/0017 |
| 2022/0034976 A1 | 2/2022 | Palascak |
| 2022/0136865 A1* | 5/2022 | Schroers ................. G01D 5/244 |
| | | 324/207.21 |
| 2022/0182066 A1* | 6/2022 | Iriguchi ................ H03M 1/468 |

OTHER PUBLICATIONS

U.S. Rule 312 Amendment filed on Oct. 14, 2022 for U.S. Appl. No. 17/374,445; 10 Pages.
U.S. Appl. No. 17/189,480, filed Mar. 2, 2021, Friedrich et al.
U.S. Appl. No. 17/374,445, filed Jul. 13, 2021, Maffei.

* cited by examiner

| 600 ⤴ | |
|---|---|
| Range Parameter | Represented number of ADC Codes |
| 7 | Full range / 128 |
| 6 | Full range / 64 |
| 5 | Full range / 32 |
| 4 | Full range / 16 |
| 3 | Full range / 8 |
| 2 | Full range / 4 |
| 1 | Full range / 2 |
| 0 | Full range |

MAGNETIC-FIELD SENSOR WITH TEST PIN FOR CONTROL OF SIGNAL RANGE AND/OR OFFSET

BACKGROUND

Magnetic-field sensors are often used to detect a ferromagnetic target. Magnetic-field sensors generally act as sensors to detect motion or position of the target. Such sensors are found in many areas of technology including robotics, automotive, manufacturing and so forth. For example, a magnetic field sensor may be used to detect when a vehicle's wheel locks up, triggering the vehicle's control processor to engage the anti-lock braking system. In this example, the magnetic-field sensor may detect rotation of the wheel. Magnetic-field sensors may also detect distance to an object. For example, a magnetic-field sensor may be used to detect the position of a hydraulic piston.

SUMMARY

In one aspect, an integrated circuit (IC) includes a magnetic-field sensor. The magnetic-field sensor includes a first magnetoresistance circuitry configured to receive a magnetic field signal from a target, and configured to convert the magnetic field signal received to a first channel signal; a second magnetoresistance circuitry configured to receive the magnetic field signal from the target, and configured to convert the magnetic field signal received to a second channel signal; analog circuitry configured to receive the first and second channel signals, and configured to provide a first analog output signal and a second analog output signal; digital circuitry comprising a first analog-to-digital converter (ADC) and a second ADC, the digital circuitry configured to receive the first analog output signal and, using the first ADC, configured to convert the first analog output signal to a first digital signal representing a first channel output signal, the digital circuitry further configured to receive the second analog output signal and, using the second ADC, configured to convert the second analog output signal to a second digital signal representing a second channel output signal, the digital circuitry further configured to provide an output signal of the IC at a first pin of the IC; and diagnostic circuitry configured to receive, from the digital circuitry, an input signal related to the first and/or the second digital signals, and configured to provide a test signal at a second pin of the IC. In response to a range parameter, the diagnostic circuitry is configured to provide the test signal comprising a range of codes from the first and/or the second ADC corresponding to the range parameter. The output signal of the first pin indicates the speed and rotational direction of the target.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Described herein are techniques to fabricate a magnetic-field sensor to include a test pin. In one example, the test pin may be used to output analog-to-digital (ADC) codes with ranges that are a subset of a full range of codes available. In one example, the ADC codes are made available at the test pin which is independent from a pin that provides rotational speed/and or rotational direction of a target. In some examples, the range of the ADC codes and an offset of the ADC codes may be determined by respective parameters. In some examples, a range parameter and an offset parameter may be stored by a user on the magnetic-field sensor using the test pin. In other examples, the range and the offset parameters may be determined automatically without user intervention.

In other examples, an output of the test pin may be used to determine if a target is properly placed with respect to the magnetic-field sensor. For example, if the magnetic-field sensor is not properly placed with respect to the target, then signals from magnetoresistance circuitries, which detect the target, may not be sufficiently separated in time to allow the magnetic-field sensor to function properly.

In a further example, an output of the test pin may be used to determine if a gear-toothed target has a tooth configuration that is valid with respect to the magnetic-field sensor. For example, if the teeth are invalid in shape and/or in their spacing from each other, then signals from magnetoresistance circuitries, which detect the target, may not be sufficiently separated in time to allow the magnetic-field sensor to function properly.

As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field. As used herein, the term "target" is used to describe an object to be sensed or detected by a magnetic-field sensor or a magnetoresistance element.

Figure 1:
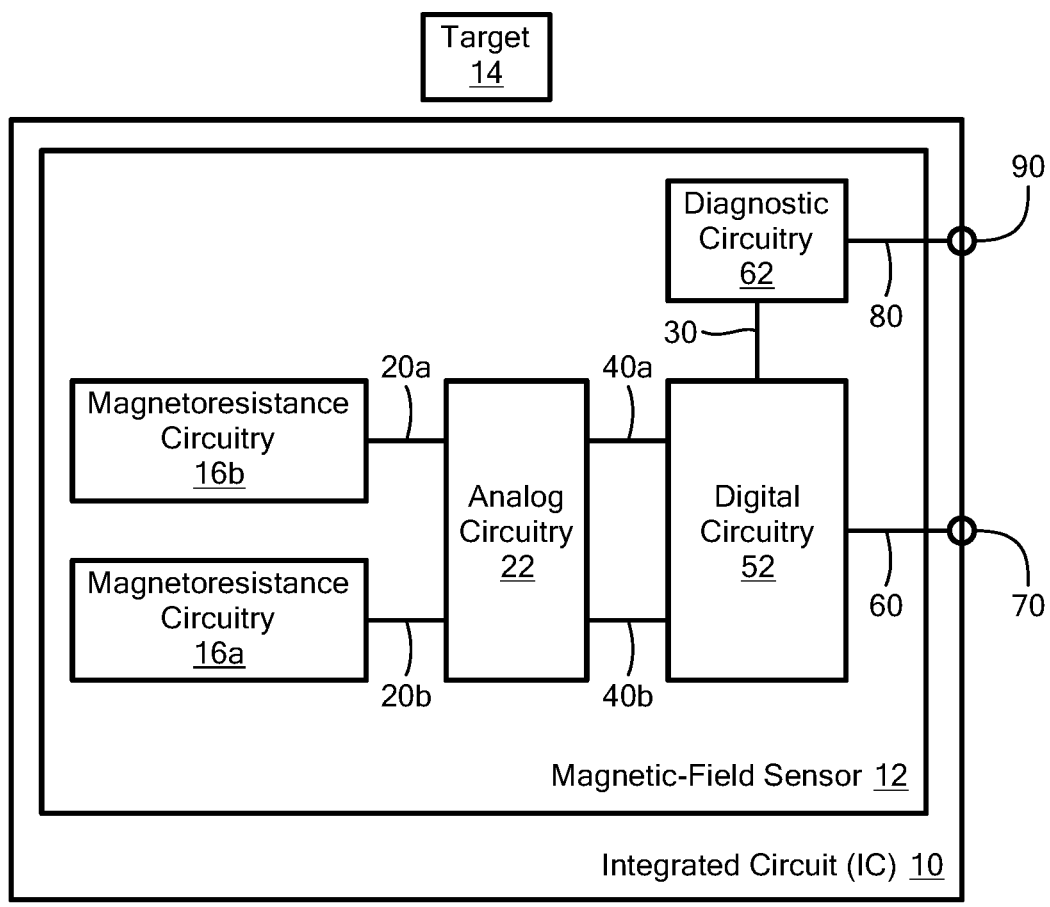
FIG. 1 is a block diagram of an example of an integrated circuit (IC) that includes a magnetic-field sensor with a test pin.

Referring to FIG. 1, an integrated circuit (IC) 10 includes a magnetic-field sensor 12, a pin 70 and a pin 90 (sometimes referred to herein as the "test pin"). The magnetic-field sensor 12 includes a first magnetoresistance circuitry 16a, a second magnetoresistance circuitry 16b, analog circuitry 22, digital circuitry 52 and diagnostic circuitry 62.

The magnetoresistance circuitry 16a, 16b are configured to receive a magnetic-field signal from a target 14. In one example, each of the magnetoresistance circuitry 16a, 16b includes magnetoresistance elements arranged in a bridge. In one example, the magnetoresistance elements may include giant magnetoresistance (GMR) elements. In another example, the magnetoresistance elements may include tunneling magnetoresistance (TMR) elements.

In response to the magnetic-field signal detected, the magnetoresistance circuitry 16a provides a signal 20a to the analog circuitry 22. The signal 20a is part of a first channel.

In response to the magnetic-field signal detected, the magnetoresistance circuitry 16b provides a signal 20b to the analog circuitry 22. The signal 20b is part of a second channel.

In response to the signal 20a, the analog circuitry 22 provides a signal 40a to the digital circuitry 52. The signal 40a is part of the first channel.

In response to the signal 20b, the analog circuitry 22 provides a signal 40b to the digital circuitry 52. The signal 40b is part of the second channel.

In some examples, the analog circuitry 22 may include amplifiers (not shown), one for each of the first and second channels. In some examples, the analog circuitry 22 may include mixers (not shown), one for each of the first and second channels. In some examples, the mixers convert their respective signal 20a, 20b to a baseband signal.

The digital circuitry 52 receives the signals 40a, 40b from the analog circuitry 22 and generates an output signal 60 to the pin 70. The output signal 60 is the output of the magnetic-field sensor 12 and the IC 10. In one example, the output signal 60 indicates the rotational speed and/or rotational direction of the target 14.

In one example, the target 14 is a ferromagnetic target. In one example, the target 14 may be a rotating target. In some examples, the rotating target may include gear teeth.

The digital circuitry 52 also provides one or more signals 30 to the diagnostic circuitry 62. In one example, in response to the one or more signals 30, the diagnostic circuitry 62 provides an output signal 80 to the test pin 90. In some examples, the output signal 80 is a DC voltage. In some particular examples, the output signal 80 is a DC voltage that ranges from 0 to 3 Volts.

In one particular example, the output signal 80 provides a DC voltage that corresponds to a percentage of channel separation between a signal from the first channel and a signal from the second channel. In another particular example, the output signal 80 provides voltages that correspond to ADC codes.

The test pin 90 is not limited to providing output signals. In some examples, the test pin 90 may be used to receive input signals that include data to be stored in the diagnostic circuitry 62.

Figure 2:
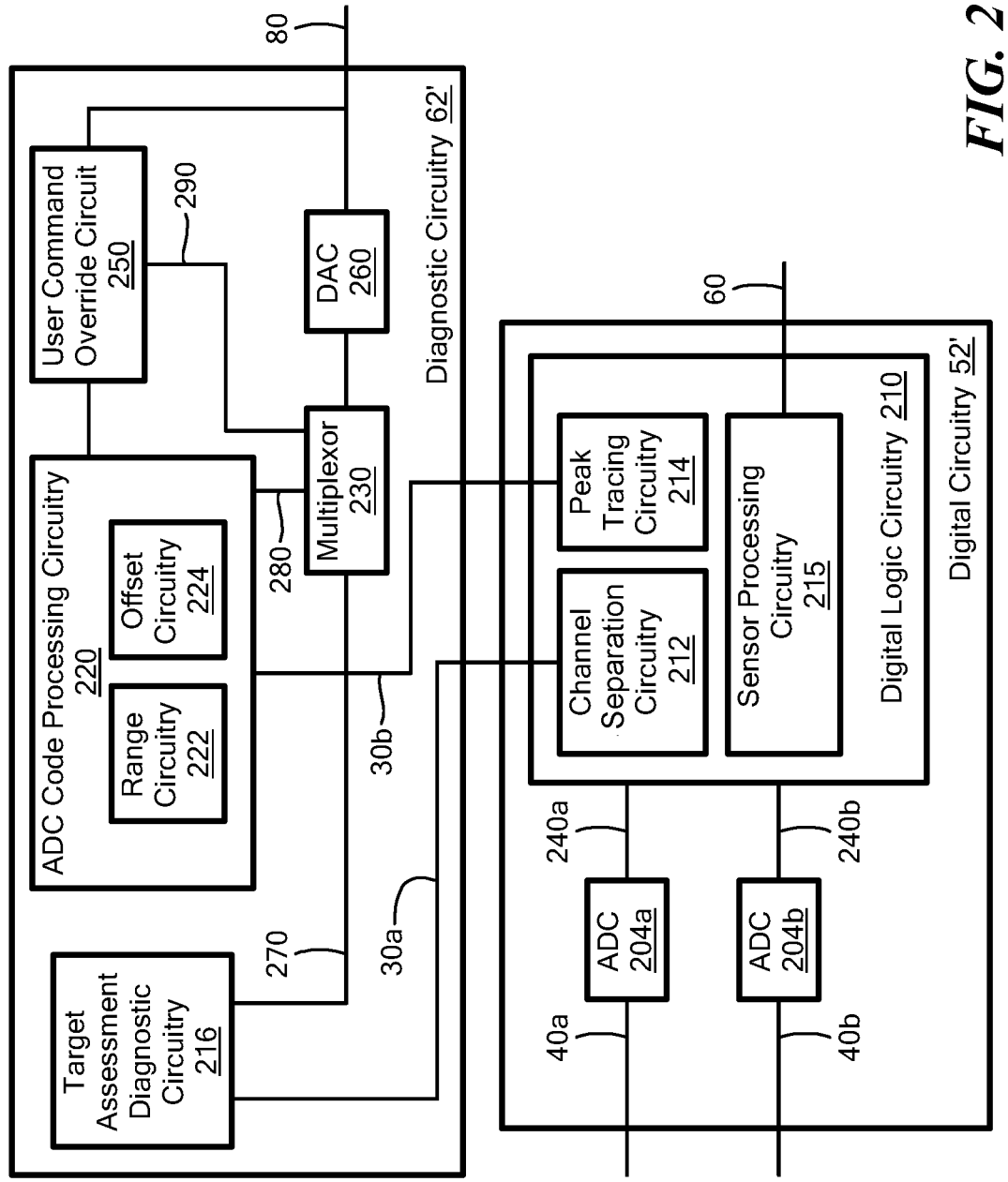
FIG. 2 is a block diagram of an example of digital circuitry and diagnostic circuitry of the magnetic-field sensor of FIG. 1.

Referring to FIG. 2, an example of the digital circuitry 52 is digital circuitry 52', and an example of the diagnostic circuitry 62 is diagnostic circuitry 62'. An example of the one or more signals 30 is a signal 30a and a signal 30b.

In one example, the digital circuitry 52' may include ADC 204a, ADC 204b and digital logic circuitry 210. In one example, the diagnostic circuitry 62' may include target assessment diagnostic 216, ADC code processing circuitry 220, multiplexor 230, user command override circuit 250, and digital-to analog converter (DAC) 260.

The ADC 204a receives the signal 40a and coverts the signal 40a from an analog signal to a digital signal 240a. The digital signal 240a is part of the first channel. The ADC 204b receives the signal 40b and coverts the signal 40b from an analog signal to a digital signal 240b. The digital signal 240b is part of the second channel. In one example, the ADC 204a, ADC 204b may be a sigma-delta ADC.

The digital logic circuitry 210 includes channel separation circuitry 212, peak tracing circuitry 214 and sensor processing circuitry 215. The digital logic circuitry 210 receives the digital signals 240a, 240b.

In response to the digital signals 240a, 240b, the sensor processing circuitry 215 generates the output signal 60. In some examples, the sensor processing circuitry 215 may include one or more of filters such as cascade filters, temperature compensation circuitry, linearization segmentation circuitry and so forth.

The channel separation circuitry 212 determines the channel separation between the first and second channels by applying one or more rules between the signal 240a and the signal 240b. The channel separation circuitry 212 provides the separation data in the signal 30a to the target assessment diagnostic circuitry 216. The target assessment diagnostic circuitry 216 normalizes this data from the signal 30a and outputs one or more signals 270 indicative of the separation between the channels to the multiplexor 230. In one example, the one or more signals 270 may include: a signal that includes separation of the channels (e.g., signal 240a and signal 240b) following a first rule, a signal that includes separation of the channels (e.g., signal 240a and signal 240b) following a second rule, and/or a signal that includes separation of the channels (signal 240a and signal 240b) that is a minimum of separation between the first and second rules. In one example, the first and second rules are described with respect to FIGS. 4A and 4B.

In one example, the multiplexor 230 may be put in a first state so that the one or more of the signals 270 is passed on to the DAC 260. In another example, the multiplexor 230 may be put in a second state so that a signal 280 from the ADC code processing circuitry 220 is passed on to the DAC 260.

In one example, the user command override circuit 250 may be used to configure the multiplexor 230 using a signal 290 to select at least one of the one or more of signals 270. In one example, a user through the test pin 90 may use the user command override circuit 250 to select one of the one or more signals 270. In some examples, the signal 290 may be used to enable the multiplexor 230 to select whether the output of the multiplexor (i.e., signal 80 (FIG. 2)) follows a first rule, follows a second rule and/or follows a combination of both the first and second rules. In one example, the first and second rules are described with respect to FIGS. 4A and 4B.

Peak tracing circuitry 214 performs peak tracing of the signals 240a, 240b. The peak tracing circuitry 214 provides the peak tracing data to the ADC code processing circuitry 220 in the signal 30b. The ADC code processing circuitry 220 determines the range and offset parameters for a selected diagnostic channel (i.e., either signal 204a or signal 204b) input ADC codes and uses the range and offset parameters to increase the signal-to-noise ratio on the provided signal 280 to the multiplexor 230. The ADC code processing circuitry 220 may include range circuitry 222 and offset circuitry 224 to store range and offset parameters, respectively. In one example, the range and offset parameters may be provided by a user using the test pin 90 through the user override circuit 250 to store range and offset data at the range circuitry 222 and offset circuitry 224, respectively. In one example, the offset parameter represents the adjustment that is made so that a signal (e.g., signal 240*a*, 240*b*) is centered within the range of ADC codes selected.

In one example, the multiplexor 230 is used to select one of the signal 270 or the signal 280 and provide the selected signal to the DAC 260. The DAC 260 converts the selected signal from a digital signal to an analog signal to generate the signal 80.

Figure 3A:
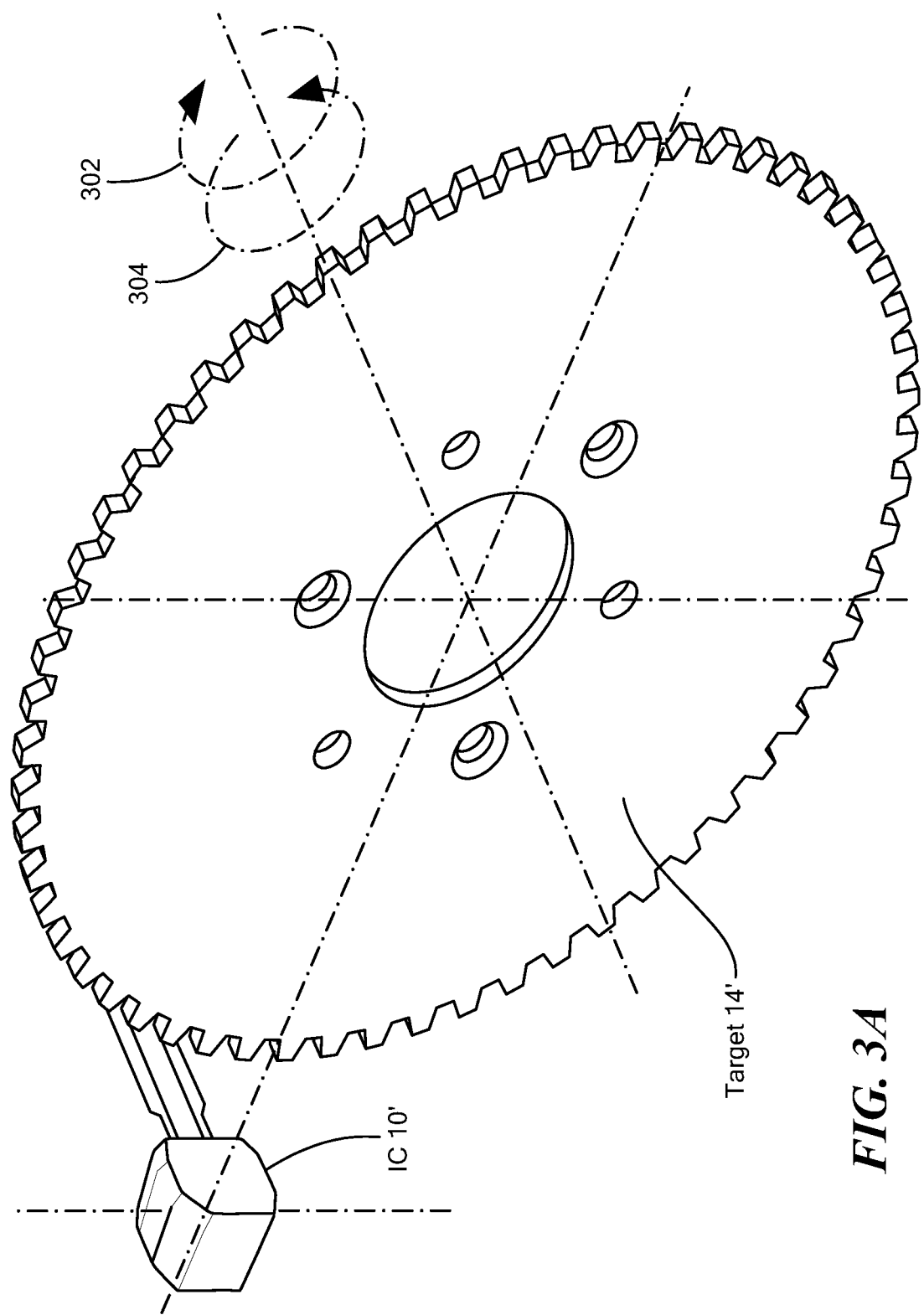
FIGS. 3A and 3B are diagrams of an example of the IC and a target.
Figure 3B:
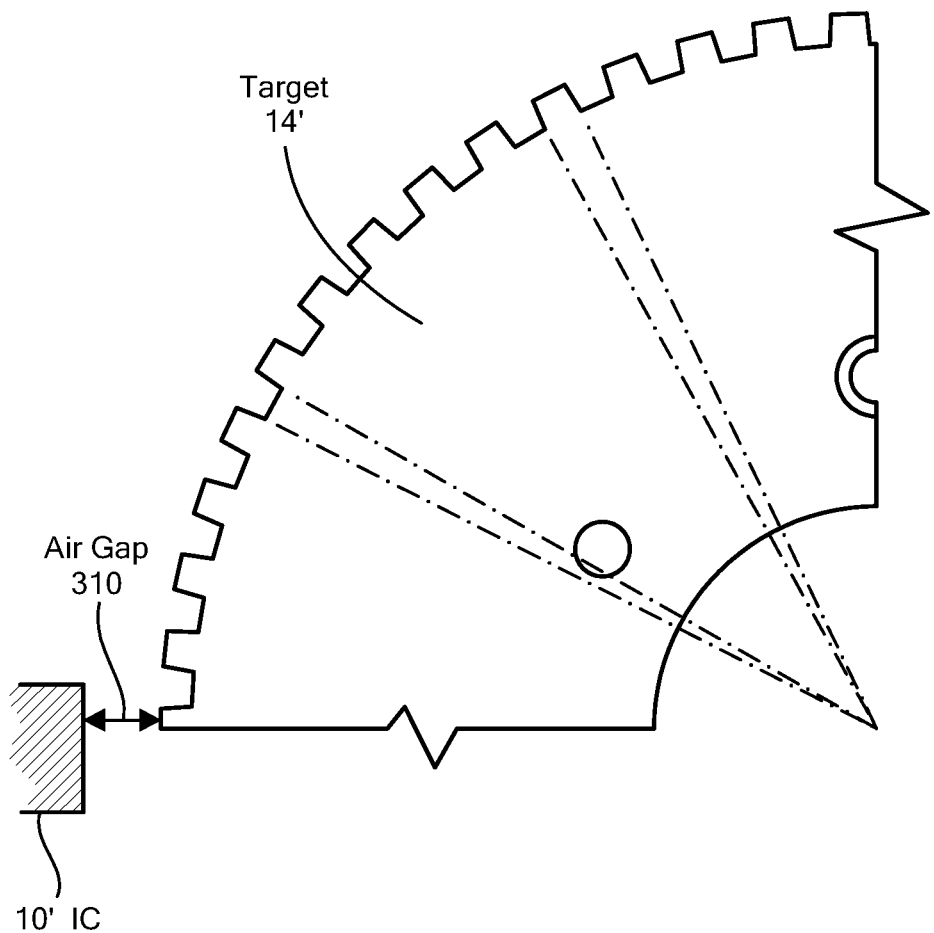

Referring to FIGS. 3A and 3B, an example of the IC 10 is an IC 10'. An example of the target 14 is a gear-toothed target 14'. The gear-toothed target 14' my rotate in a clockwise direction 302 or a counterclockwise direction 304. The gear-toothed target 14' and the IC 10' are separated by an air gap 310.

Figure 4A:
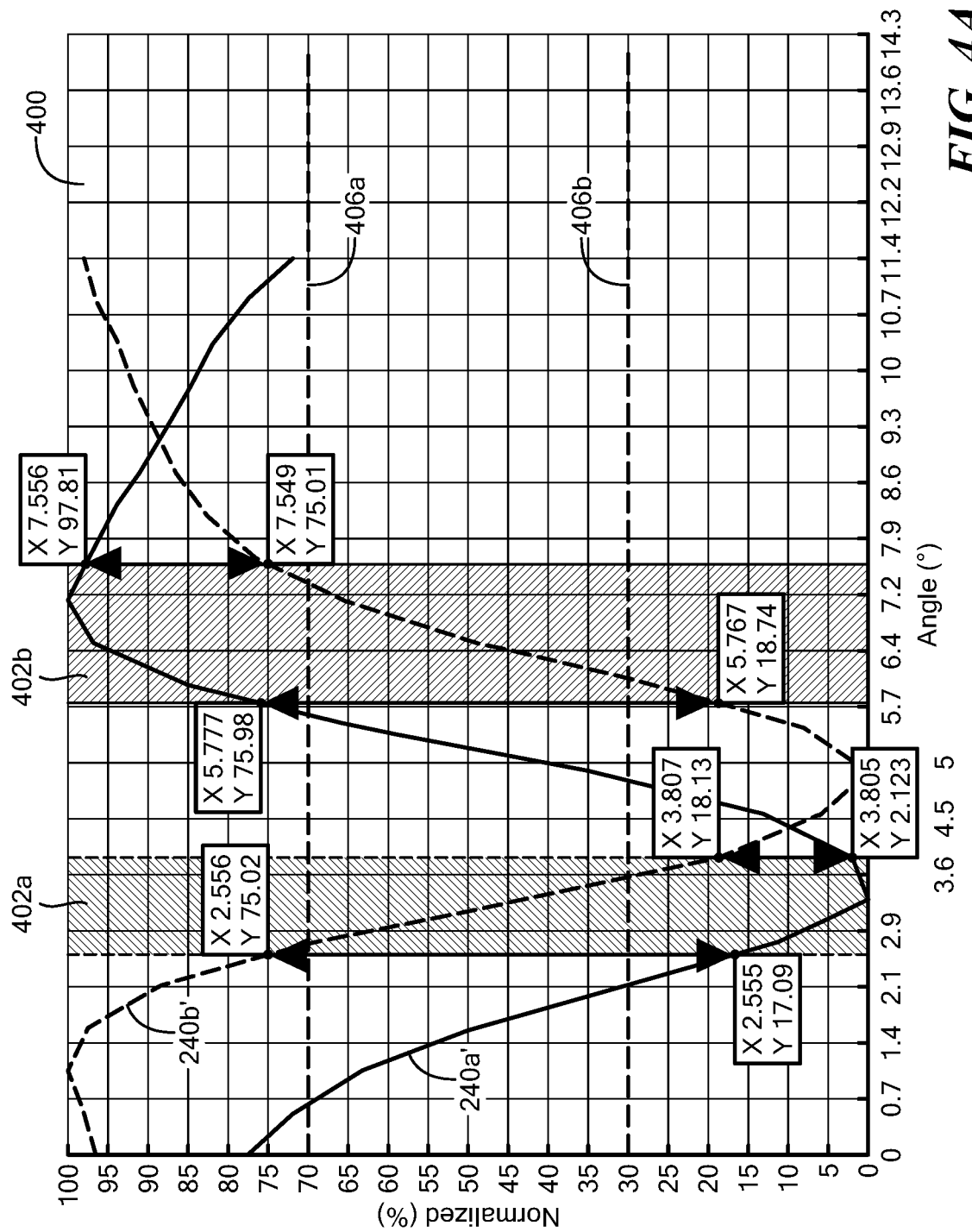
FIG. 4A is a graph of an example of first and second channel signals used in a first rule.

Referring to FIG. 4A, a graph 400 is an example of a first rule used by the channel separation circuitry 212 (FIG. 2) in determining separation between the first and second channels. An example of the signal 240*a* from the first channel is a signal 240*a'* and an example of the signal 240*b* from the second channel is a signal 240*b'*. In this example, the air gap 310 (FIG. 3B) is 2.5 mm.

A dotted line 406*a* represents an example of a magnetic switch point called a magnetic flux operating point (bop switch point). A dotted line 406*b* represents an example of a magnetic switch point called a magnetic flux release point (brp switch point).

When the signal 240*a'* of the first channel has a falling slope that is less than 75% and greater than 18.75% as measured in a box 402*a*, the channel separation circuitry 212 determines the average separation between the first and second channel to be:

$$|Max(ch1-ch2)+Min(ch1-ch2)|/2,$$

where ch1 is the signal 240*a'* and ch2 is the signal 240*b'*. In this example, the average separation is equal to 37.26% for the box 402*a*.

When the signal 240*a'* of the first channel has a rising slope that is greater than 18.75% and less than 75% as measured in the box 402*b*, the channel separation circuitry 212 determines the average separation between the first and second channel to be:

$$|Max(ch1-ch2)+Min(ch1-ch2)|/2$$

In this example, the average separation is equal to 40% for the box 402*b*.

The minimum between the box 402*a* value or 37.26% and the box 402*b* value or 40% is the minimum channel separation or 37.26%. The target assessment diagnostic circuitry 216 (FIG. 2) receives this data and normalizes the data such that 50% channel separation is represented as the maximum DAC 260 (FIG. 2) value and 0% is represented as the minimum DAC 260 (FIG. 2) value.

Figure 4B:
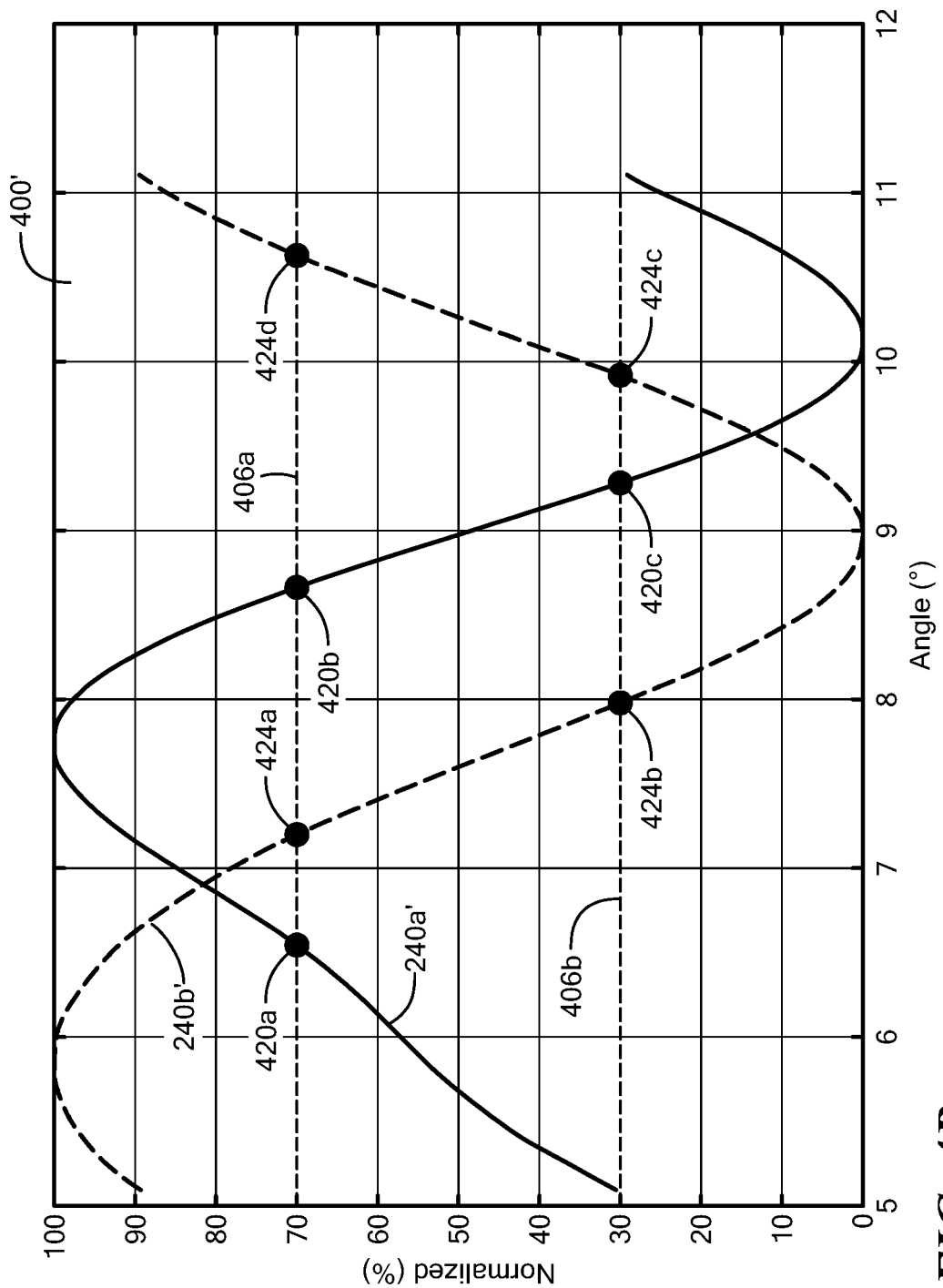
FIG. 4B is graph of an example of the first and second channel signals used in a second rule.

Referring to FIG. 4B, graph 400' is an example of a second rule used by the target assessment diagnostic circuitry 216 (FIG. 2) in determining separation between signals from the first and second channels (e.g., signals 240*a'*, 240*b'*). In this example, the air gap 310 (FIG. 3B) is 2.5 mm.

The target assessment diagnostic circuitry 216 determines channel separation at each signal 240*a'* and 240*b'* intersections with the 406*a* and 406*b* switching points (e.g., at points 420*a*-420*c* and points 424*a*-424*d*). For each intersection, the DC voltage of the signal 270 (FIG. 2) is updated to represent the percentage of channel separation.

Referring back to FIG. 2, in another example, the user command override circuit 250 may be used through the signal; 290 to enable the multiplexor 230 to select at least one of the one or more signals 280 so that the output of the multiplexor may include at least one of: the signal 240*a'*, positive peak data from the signal 240*a'*, negative peak data from the signal 240*a'*, switching points from the signal 240*a'* (e.g., 420*a*, 420*b*, 420*c* (FIG. 4B)), peak-to-peak data from the signal 240*a'*, the signal 240*b'*, positive peak data from the signal 240*b'*, negative peak data from the signal 240*b'*, switching points from the signal 240*b'* (e.g., 424*a*, 424*b*, 424*c*, 424*d* (FIG. 4B)), and/or peak-to-peak data from the signal 240*b'*.

Figure 5:
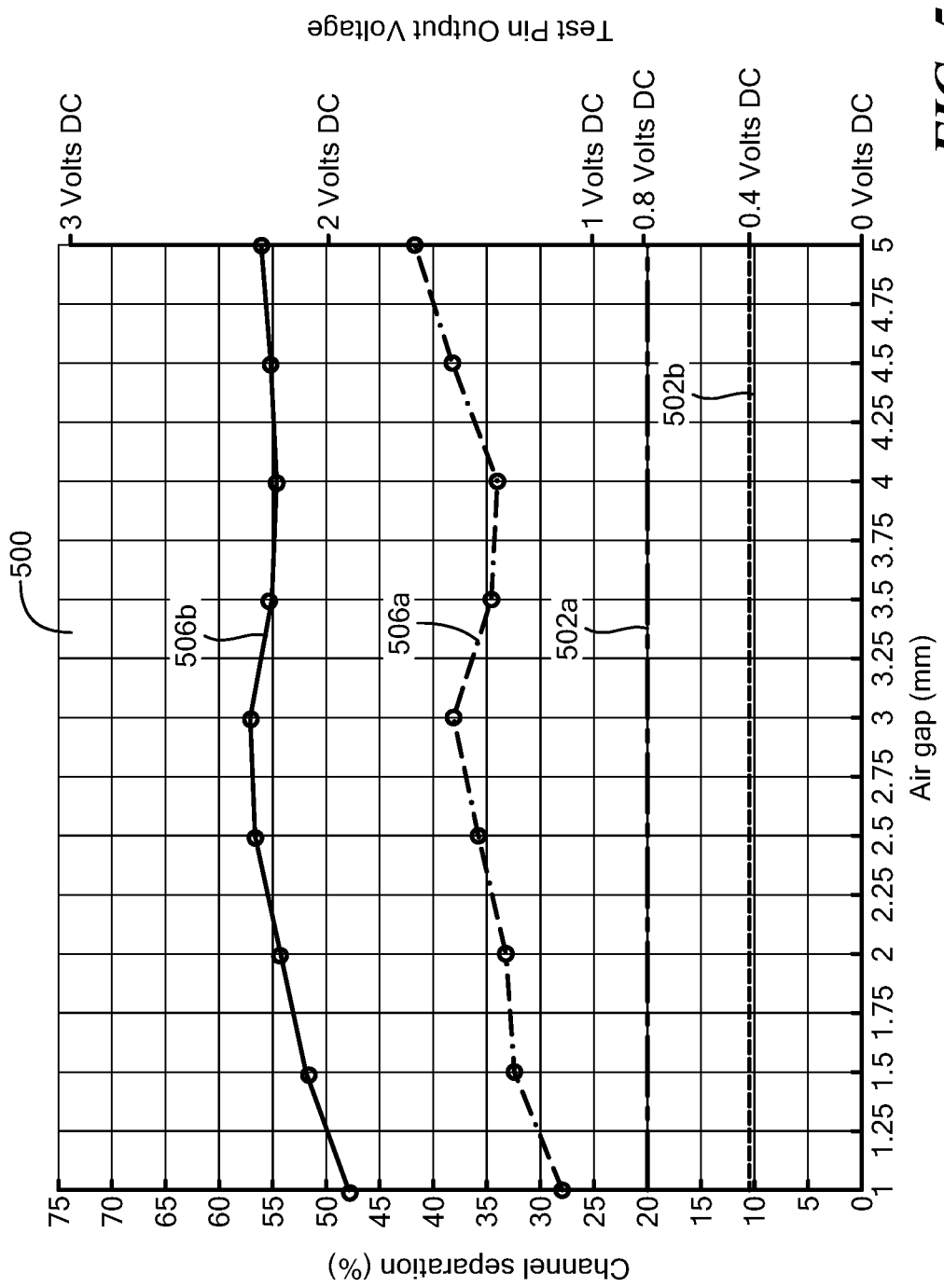
FIG. 5 is a graph of an example of channel separation and test pin output voltage versus air gap.

Referring to FIG. 5, a graph 500 includes a line 502*a* representing the minimum channel separation to be valid under a first rule (e.g., FIG. 4A) and a line 502*b* representing the minimum channel separation to be valid under a second rule (e.g., FIG. 4B). The graph 500 also includes, for various air gaps, a curve 506*a* representing an example of measurements taken under the first rule, and a curve 506*b* representing an example of measurements taken under the second rule using the magnetic-field sensor 12 (FIG. 1).

In this example, measurements for the curve 506*a* are all valid since all its points are above the line 502*a*. In this example, measurements for the curve 506*b* are all also valid since all its points are above the line 502*b*.

In one particular example, the channel separation corresponds to a DC voltage provided to the test pin 90 (FIG. 1). The minimal channel separation under the first rule 502*a* is equal to 0.8 Volts. Thus, any measured values at the test pin 90 that are greater than 0.8 Volts are valid under the first rule.

The minimal channel separation under the second rule 502*b* is equal to 0.4 Volts. Thus, any measured values at the test pin 90 that are greater than 0.4 Volts are valid under the second rule.

Figures 6, 7:
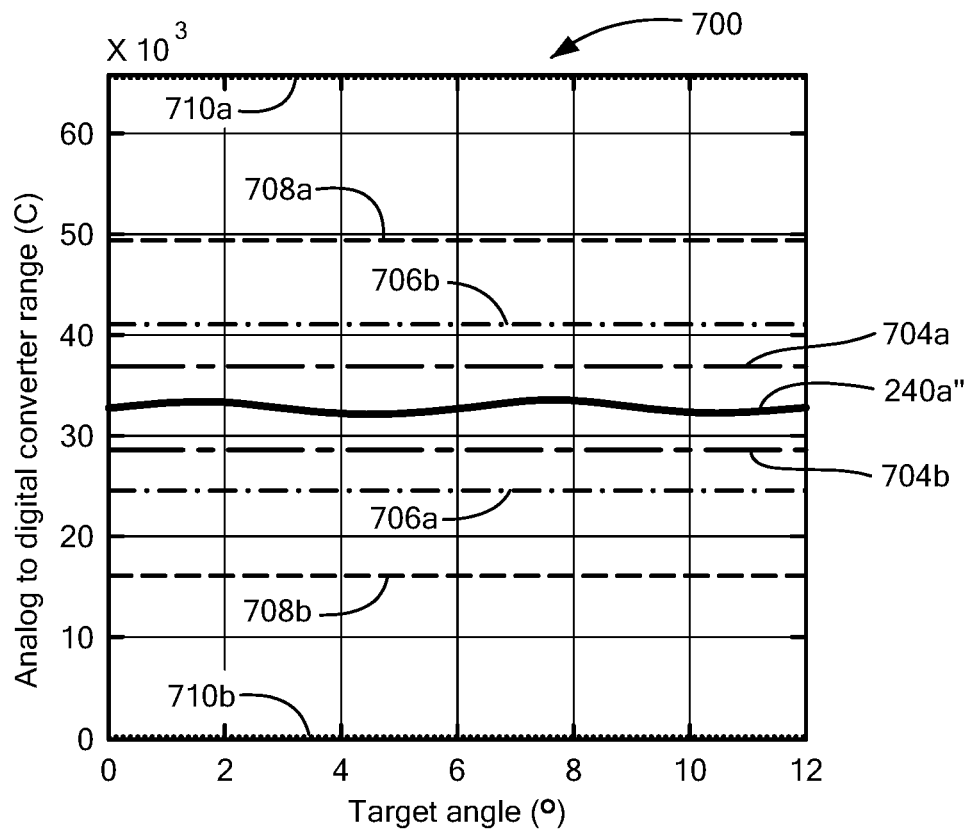
FIG. 6 is a table of an example of range parameters.
FIG. 7 is a graph of examples of analog-to-digital converter (ADC) ranges versus target angle.

Referring to FIG. 6, an example of different ranges of ADC codes corresponding to a range parameter that may be used is shown in table 600. ADC codes that are available is equal to $2^x-1$. In the particular example shown in the table 600, x is equal to 16, so that the amount of total ADC codes available or full range is 65,535.

The full range may be divided $2^n$ as shown in table 600. For example, range parameter of 0 is equal to the full range divided by $2^0$ or 1, range parameter 1 is equal to the full range divided by $2^1$ or 2, range parameter 2 is equal to the full range divided by $2^2$ or 4, range parameter 3 is equal to the full range divided by $2^3$ or 8, range parameter 4 is equal to the full range divided by $2^4$ or 16, range parameter 5 is equal to the full range divided by $2^5$ or 32, range parameter 6 is equal to the full range divided by $2^6$ or 64, and range parameter 7 is equal to the full range divided by $2^7$ or 128.

Referring to FIG. 7, a graph 700 is an example of the ADC codes for a signal 240*a"*, which is an example of the signal 240*a* (FIG. 2). The graph 700 is an example of using ADC code parameters used in the table 600 (FIG. 6).

The line 704*a* and the line 704*b* represent an upper and lower bounds, respectively for a range parameter 3 forming a first window, where the signal 240*a"* is centered within the first window. The line 706*a* and the line 706*b* represent an upper and lower bounds, respectively for a range parameter 2 forming a second window, where the signal 240*a"* is centered within the second window. The line 708*a* and the line 708*b* represent an upper and lower bounds, respectively for a range parameter 1 forming a third window, where the signal 240*a"* is centered within the third window. The line 710*a* and the line 710*b* represent an upper and lower bounds, respectively for a range parameter 0 forming a fourth window, where the signal 240a" is centered within the fourth window.

Figure 8:
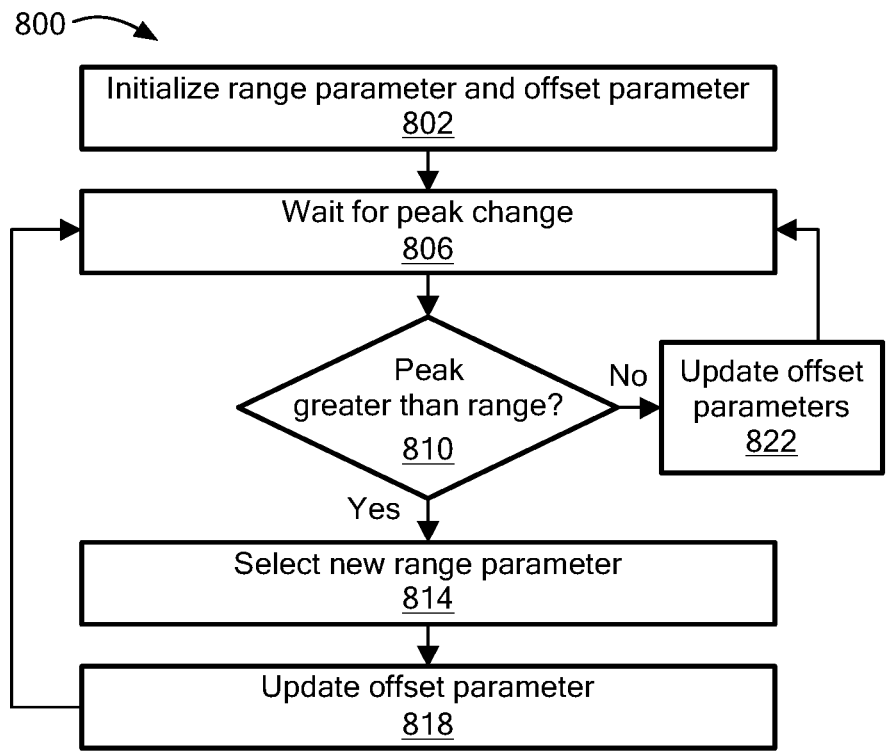
FIG. 8 is a flowchart of an example of a process to determine range and offset parameters.

Referring to FIG. 8, an example of a process to determine a range parameter and an offset parameter is a process 800. Process 800 initializes a range parameter and an offset parameter (802). Process 800 waits for a peak change (806). For example, the ADC code processing circuitry 220 uses the peak tracing from the peak tracing circuitry 214 to determine if the peaks in the signals 240a, 240b have changed.

Process 800 determines if a peak that has changed is greater than a current range of ADC codes (810). If process 800 determines that a peak that has changed is greater than the current range s, then process 800 selects a new range parameter (814) and process 800 updates the offset parameter (818). If process 800 determines that the peak that has changed is not greater than the current range, then process 800 updates the offset parameter (822).

Figure 9:
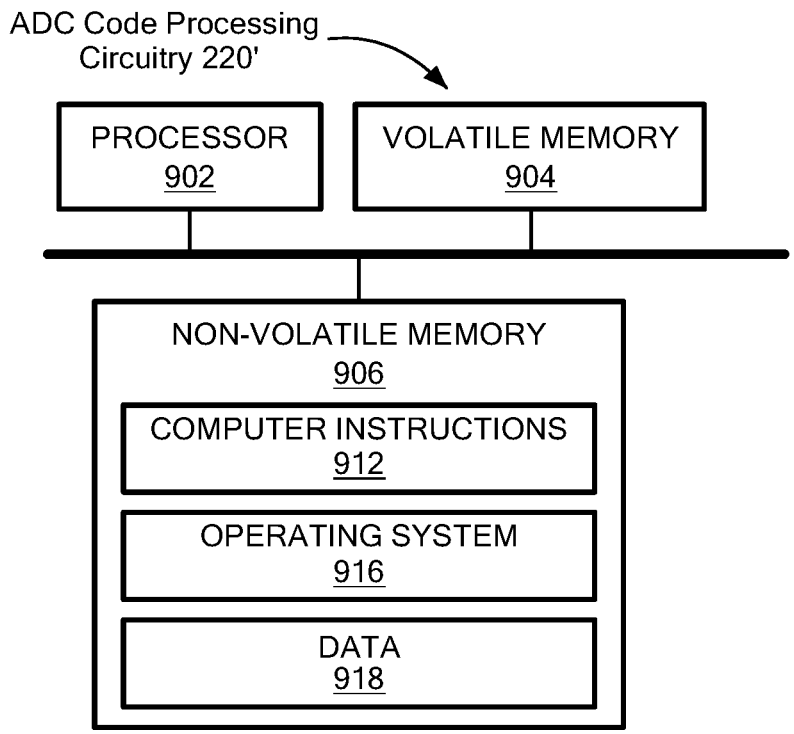
FIG. 9 is a block diagram of an example of a processor to perform all or part of the process of FIG. 8.

Referring to FIG. 9, an example of the ADC code processing circuitry 220 is the ADC code processing circuitry 220'. In one example, the ADC code processing circuitry 220' includes a processor 902, a volatile memory 904, and a non-volatile memory 906. The non-volatile memory 906 stores computer instructions 912, an operating system 916 and data 918. In one example, the computer instructions 912 are executed by the processor 902 out of volatile memory 904 to perform all or part of the processes described herein (e.g., process 800).

The processes described herein (e.g., process 800) are not limited to use with the hardware and software of FIG. 9; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers)). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se. The processes described herein are not limited to the specific examples described. For example, the process 800 is not limited to the specific processing order of FIG. 8. Rather, any of the processing blocks of FIG. 8 may be re-ordered, combined, or removed, performed in parallel or in serial, as necessary, to achieve the results set forth above.

The processing blocks (for example, in the process 800) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, a programmable logic device or a logic gate.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated circuit (IC) comprising:
   a magnetic-field sensor comprising:
   a first magnetoresistance circuitry configured to receive a magnetic field signal from a target, and configured to convert the magnetic field signal received to a first channel signal;
   a second magnetoresistance circuitry configured to receive the magnetic field signal from the target, and configured to convert the magnetic field signal received to a second channel signal;
   analog circuitry configured to receive the first and second channel signals, and configured to provide a first analog output signal and a second analog output signal;
   digital circuitry comprising peak tracing circuitry, a first analog-to-digital converter (ADC) and a second ADC, the digital circuitry configured to receive the first analog output signal and, using the first ADC, configured to convert the first analog output signal to a first digital signal representing a first channel output signal, the digital circuitry further configured to receive the second analog output signal and, using the second ADC, configured to convert the second analog output signal to a second digital signal representing a second channel output signal, the digital circuitry further configured to provide an output signal of the IC at a first pin of the IC, wherein the output signal of the first pin indicates a speed and rotational direction of the target; and diagnostic circuitry comprising ADC code processing circuitry, the diagnostic circuitry configured to receive, from the digital circuitry, an input signal related to the first and/or the second digital signals, and configured to provide a test signal at a second pin of the IC, wherein in response to a range parameter, the diagnostic circuitry is configured to provide the test signal comprising a range of codes from the first and/or the second ADC corresponding to the range parameter, wherein the input signal is sent from the peak tracing circuitry to the ADC code processing circuitry, wherein the ADC code processing circuitry comprises electronic circuitry configured to:
 initialize the range parameter and an offset parameter;
 wait for a change in a peak from the first or second channel output signals using peak tracing from the peak tracing circuitry to determine if one of the peaks in the first or second channel output signals have changed;
 determine if the peak that has changed is greater than a current range of ADC codes;
 select a new range parameter and update the offset parameter if the peak that has changed is greater than the current range; and
 update the offset parameter if the peak that has changed is not greater than the current range of ADC codes.

2. The IC of claim 1, wherein the target is a rotatable target.

3. The IC of claim 2, wherein the rotatable target is a ferromagnetic target.

4. The IC of claim 3, wherein the rotatable target is a gear-toothed wheel.

5. The IC of claim 1, wherein the test signal is a DC voltage.

6. The IC of claim 5, wherein the test signal ranges from 0 volts to 3 volts.

7. The IC of claim 5, wherein the DC voltage corresponds to a code from the ADC.

8. The IC of claim 1, wherein the range parameter is used to select a full range of codes equal to $2^x-1$, where x is at least equal to 16.

9. The IC of claim 1, wherein in response to the offset parameter, the diagnostic circuitry provides the test signal comprising a range of codes from the ADC with an offset corresponding to the offset parameter.

10. The IC of claim 1, further comprising a user override circuit connected to the second pin of the IC and to the diagnostic circuitry,
 wherein the diagnostic circuitry is configured to receive and to store a user signal from the user override circuit provided by a user inputting the user signal at the second pin of the IC,
 wherein the user signal includes the range parameter and the offset parameter.

11. An integrated circuit (IC) comprising:
 a magnetic-field sensor comprising:
  a first magnetoresistance circuitry configured to receive a magnetic field signal from a target, and configured to convert the magnetic field signal received to a first channel signal;
  a second magnetoresistance circuitry configured to receive the magnetic field signal from the target, and configured to convert the magnetic field signal received to a second channel signal;
 analog circuitry configured to receive the first and second channel signals, and configured to provide a first analog output signal and a second analog output signal;
 digital circuitry comprising a first analog-to-digital converter (ADC) and a second ADC, the digital circuitry configured to receive the first analog output signal and, using the first ADC, configured to convert the first analog output signal to a first digital signal representing a first channel output signal, the digital circuitry further configured to receive the second analog output signal and, using the second ADC, configured to convert the second analog output signal to a second digital signal representing a second channel output signal, the digital circuitry further configured to provide an output signal of the IC at a first pin of the IC, wherein the output signal of the first pin indicates a speed and rotational direction of the target; and
 diagnostic circuitry configured to receive, from the digital circuitry, an input signal related to the first and/or the second digital signals, and configured to provide a test signal at a second pin of the IC,
 wherein in response to a range parameter, the diagnostic circuitry is configured to provide the test signal comprising a range of codes from the first and/or the second ADC corresponding to the range parameter,
 wherein the range parameter is used to select a full range of codes equal to $2^x-1$, where x is at least equal to 16, and
 wherein the range parameter is used to select a range of codes equal to the full range of codes divided by $2^n$, where n is less than x.

12. The IC of claim 11, wherein the digital circuitry comprises peak tracing circuitry,
 wherein the diagnostic circuitry comprises ADC code processing circuitry, and
 wherein the input signal related to the ADC is sent from the peak tracing circuitry to the ADC code processing circuitry.

13. An integrated circuit (IC) comprising:
 a magnetic-field sensor comprising:
  a first magnetoresistance circuitry configured to receive a magnetic field signal from a target, and configured to convert the magnetic field signal received to a first channel signal;
  a second magnetoresistance circuitry configured to receive the magnetic field signal from the target, and configured to convert the magnetic field signal received to a second channel signal;
 analog circuitry configured to receive the first and second channel signals, and configured to provide a first analog output signal and a second analog output signal;
 digital circuitry comprising a first analog-to-digital converter (ADC) and a second ADC, the digital circuitry configured to receive the first analog output signal and, using the first ADC, configured to convert the first analog output signal to a first digital signal representing a first channel output signal, the digital circuitry further configured to receive the second analog output signal and, using the second ADC, configured to convert the second analog output signal to a second digital signal representing a second channel output signal, the digital circuitry further configured to provide an output signal of the IC at a first pin of the IC, wherein the output signal of the first pin indicates a speed and rotational direction of the target; and diagnostic circuitry configured to receive, from the digital circuitry, an input signal related to the first and/or the second digital signals, and configured to provide a test signal at a second pin of the IC, wherein in response to a range parameter, the diagnostic circuitry is configured to provide the test signal comprising a range of codes from the first and/or the second ADC corresponding to the range parameter, wherein the input signal is a first input signal, wherein the digital circuitry comprises channel separation circuitry, wherein the diagnostic circuitry is further configured to receive, from the digital circuitry, a second input signal related to a separation of the first channel output signal and the second channel output signal, wherein the diagnostic circuitry comprises:
a multiplexor; and
target assessment diagnostic circuitry, wherein the second input signal related to a separation of the first channel output signal and the second channel output signal is sent from the channel separation circuitry to the target assessment diagnostic circuitry, wherein the IC and the target are separated by a distance, wherein the target is a gear-toothed target having a plurality of teeth, wherein with the multiplexor in a first state and in response to the diagnostic circuitry receiving the first input signal from the digital circuitry, the diagnostic circuitry is configured to provide the test signal indicating whether the distance between the magnetic-field sensor and the target, spacing between the teeth and shape of the teeth, comply with at least one rule, and wherein with the multiplexor in a second state and in response to a range parameter and an offset parameter, the diagnostic circuitry is configured to provide the test signal comprising a range of codes from the first and/or the second ADC corresponding to the range and offset parameters.

14. The IC of claim 13, wherein the at least one rule comprises a rule related to average separation of the first and second channel signals.

15. The IC of claim 13, wherein the at least one rule comprises a rule related to at least one magnetic flux switch point.

16. The IC of claim 13, wherein the gear-toothed target is a gear-toothed wheel, wherein the diagnostic circuitry is further configured to provide the test signal indicating whether spacing between teeth of the gear-toothed wheel complies with at least one rule, whether a shape of teeth of the gear-toothed wheel complies with the at least one rule.

17. The IC of claim 13, wherein the test signal is a DC voltage, and wherein the DC voltage corresponds to a separation in time of the first channel signal with respect to the second channel signal.

18. The IC of claim 13, wherein the digital circuitry comprises peak tracing circuitry, wherein the diagnostic circuitry comprises ADC code processing circuitry, and wherein the first input signal is sent from the peak tracing circuitry to the ADC code processing circuitry.

19. The IC of claim 18, wherein the ADC code processing circuitry comprises electronic circuitry configured to:
initialize the range parameter and an offset parameter;
wait for a change in a peak from the first or second channel output signals using peak tracing from the peak tracing circuitry to determine if one of the peaks in the first or second channel output signals have changed;
determine if the peak that has changed is greater than a current range of ADC codes;
select a new range parameter and update the offset parameter if the peak that has changed is greater than the current range; and
update the offset parameter if the peak that has changed is not greater than the current range of ADC codes.

20. The IC of claim 13, wherein the diagnostic circuitry is configured to receive a signal at the second pin that enables the multiplexor to select at least one of the first channel output signal, positive peak data from the first channel output signal, negative peak data from the first channel output signal, switching points from the first channel output signal, peak-to-peak data from the first channel output signal, the second channel output signal, positive peak data from the second channel output signal, negative peak data from the second channel output signal, switching points from the second channel output signal, and/or peak-to-peak data from the second channel output signal.

21. The IC of claim 13, wherein the diagnostic circuitry is configured to receive a signal at the second pin that enables the multiplexor to select at least one of a signal that includes a separation of the first channel output signal and the second channel output signal following a first rule, a signal that includes a separation of a separation of the first channel output signal and the second channel output signal following a second rule, and/or a signal that includes a separation of the a separation of the first channel output signal and the second channel output signal that is a minimum of separation between the first and second rules.

\* \* \* \* \*